United States Patent
McGee et al.

(10) Patent No.: US 6,809,517 B2
(45) Date of Patent: Oct. 26, 2004

(54) MAGNETIC RESONANCE IMAGING OF PROSTATE BRACHYTHERAPY SEEDS

(75) Inventors: Kiaran McGee, Rochester, MN (US); Joel Felmlee, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 0 days.

(21) Appl. No.: 10/016,527

(22) Filed: Dec. 10, 2001

(65) Prior Publication Data

US 2003/0107375 A1 Jun. 12, 2003

(51) Int. Cl.[7] .................................................. G01V 3/00
(52) U.S. Cl. ...................... 324/309; 324/307; 600/420; 600/424; 600/411
(58) Field of Search ................................ 600/407, 410, 600/419, 437, 8, 420, 424, 411; 324/307, 309, 318

(56) References Cited

U.S. PATENT DOCUMENTS

| | | | |
|---|---|---|---|
| 4,678,995 A | | 7/1987 | Avison et al. |
| 5,162,737 A | | 11/1992 | Nozokido et al. |
| 5,216,366 A | | 6/1993 | Young |
| 5,226,418 A | * | 7/1993 | Bernstein et al. ........... 600/419 |
| 5,227,969 A | | 7/1993 | Waggener et al. |
| 5,565,777 A | | 10/1996 | Kanayama et al. |
| 5,626,829 A | | 5/1997 | Koutrouvelis |
| 5,730,129 A | * | 3/1998 | Darrow et al. .............. 600/407 |
| 5,868,757 A | | 2/1999 | Koutrouvelis |
| 5,909,119 A | | 6/1999 | Zhang et al. |
| 6,099,457 A | | 8/2000 | Good |
| 6,150,814 A | | 11/2000 | Redpath et al. |
| 6,200,258 B1 | * | 3/2001 | Slater et al. .................... 600/8 |
| 6,275,038 B1 | * | 8/2001 | Harvey ........................ 324/309 |
| 6,332,088 B1 | * | 12/2001 | Zhang et al. ............... 600/410 |
| 6,368,275 B1 | * | 4/2002 | Silwa et al. ................. 600/437 |

OTHER PUBLICATIONS

"Characteristics of magnetic resonance sequences used for imaging silicone gel, saline, and gel–saline implants at low field strength." Frankel et al., Investigative radiology (United States) Aug. 1994, 29 (8) p781–6, ISSN 0020–9996.*

"Magnetic resonance imaging of titanium anterior cervical spine plating systems" Tominaga et al., Neurosurgery (NEUROSURGERY) (United States) 1995, 36/5 (951–955) CODEN: NRSRD ISSN: 0148–396X.*

"Evaluation of permanent I–125 prostate implants using radiography and megnetic resonance imaging". Moerland et al., International journal of radiation oncology, biology, physics (United States) Mar 1, 1997, 37 (4) p927–33, ISSN 0360–0316.*

* cited by examiner

*Primary Examiner*—Edward Lefkowitz
*Assistant Examiner*—Tiffany A. Fetzner
(74) *Attorney, Agent, or Firm*—Quarles & Brady, LLP

(57) ABSTRACT

Two magnetic resonance images are acquired of seeds used in brachytherapy of the prostate with different pulse sequences. Phase images and magnitude images are reconstructed and a phase difference image is calculated and combined with the magnitude images. The magnitude images differentiate soft tissues and the phase difference image differentiates the locations of the seeds.

16 Claims, 5 Drawing Sheets

MAGNETIC RESONANCE IMAGING OF PROSTATE BRACHYTHERAPY SEEDS

BACKGROUND OF THE INVENTION

The field of the invention is nuclear magnetic resonance imaging (MRI) methods and systems. More particularly, the invention relates to the imaging of soft tissues and implanted devices such as brachytherapy seeds.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles under the direction of prescribed pulse sequences in which these gradients vary according to the particular localization method being used. The resulting set of received NMR signals are digitized and processed to reconstruct the image using one of many well known reconstruction techniques.

An advantage of MR imaging over other imaging modalities such as x-ray CT is its ability to differentiate between different soft tissues. The amplitude of the received NMR signal during a measured cycle is determined by a number of factors related to the molecular bonding of the excited spins with surrounding atoms. These factors can be magnified, or "weighted" by the choice of imaging pulse sequence scan parameters to enhance the contrast between different tissue types.

Unfortunately, MR imaging does not provide optimal contrast between certain implants and surrounding soft tissues. Seeds used in brachytherapy of the prostate, for example, are small cylindrical-shaped objects made of titanium which are implanted in a malignancy. Accurate placement of these seeds is critical for the proper treatment of the disease and it is normal practice to image the prostate following implantation to confirm placement. Currently, x-ray CT is the preferred imaging modality for this purpose because it produces an image in which the seeds are highly contrasted with surrounding soft tissues. The limitation with x-ray CT, however, is that it does not contrast one soft tissue from another very well, making it difficult to discern the prostate tissue and the malignancy therein.

SUMMARY OF THE INVENTION

The present invention is a method for acquiring and reconstructing an MR image which provides the high contrast between different tissues normally associated with this imaging modality and high contrast between implanted objects and surrounding soft tissues. More particularly, a complex k-space data set is acquired with the MRI system; a magnitude image is reconstructed from the k-space data set; a phase image is reconstructed from the k-space data set; the location of the implanted objects is determined from the phase image; and the determined location of the implanted objects is indicated on the magnitude image.

An object of the invention is to produce an image which differentiates between soft tissues and differentiates between implanted objects and surrounding soft tissues. It has been discovered that a phase MR image provides sharp contrast between implants and surrounding soft tissue. When combined with a conventional magnitude image that differentiates between soft tissues, the phase image provides the additional contrast mechanism for locating the implants.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DESCRIPTION OF THE PREFERRED EMBODIMENT

Figure 1:
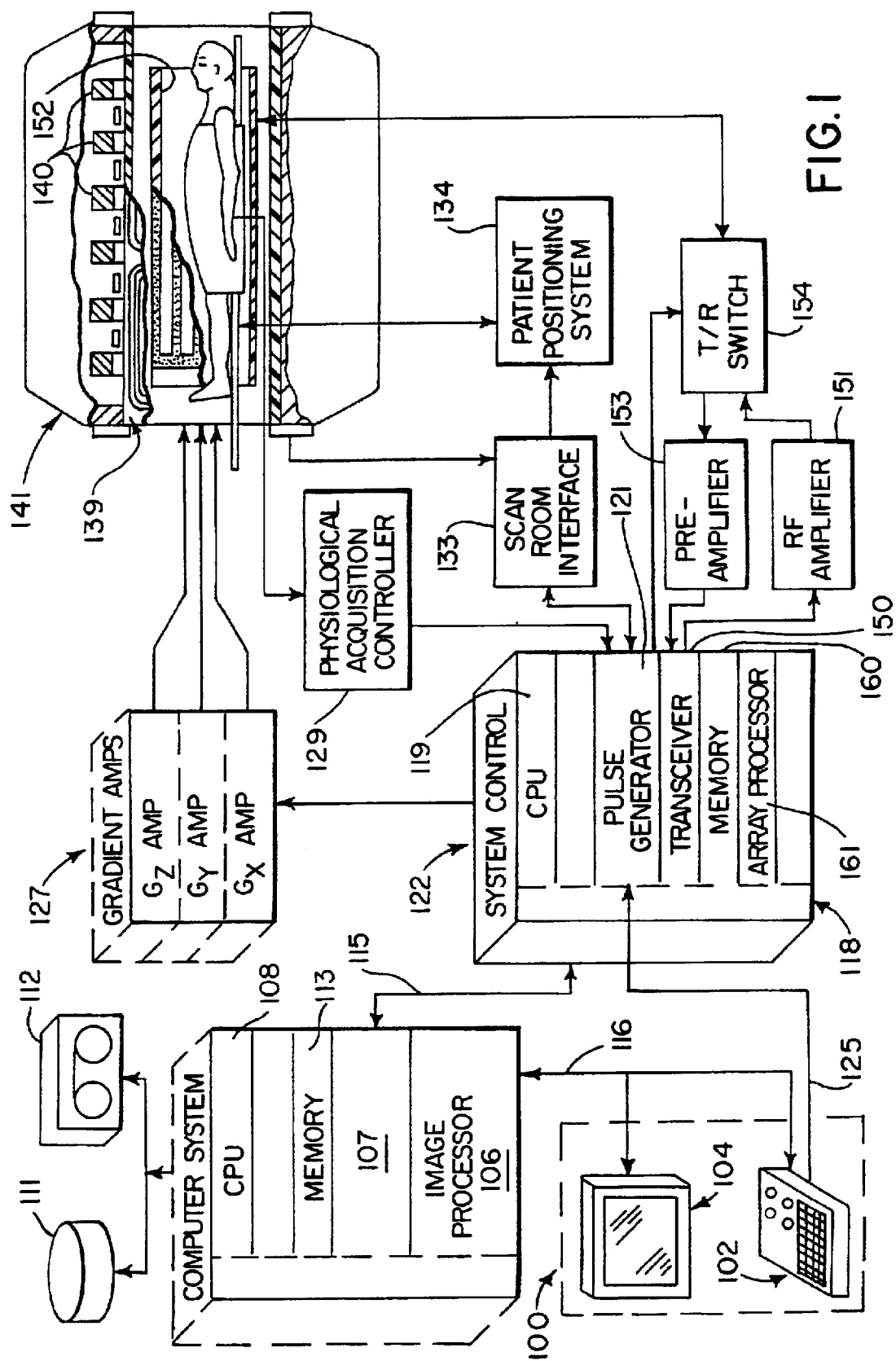
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
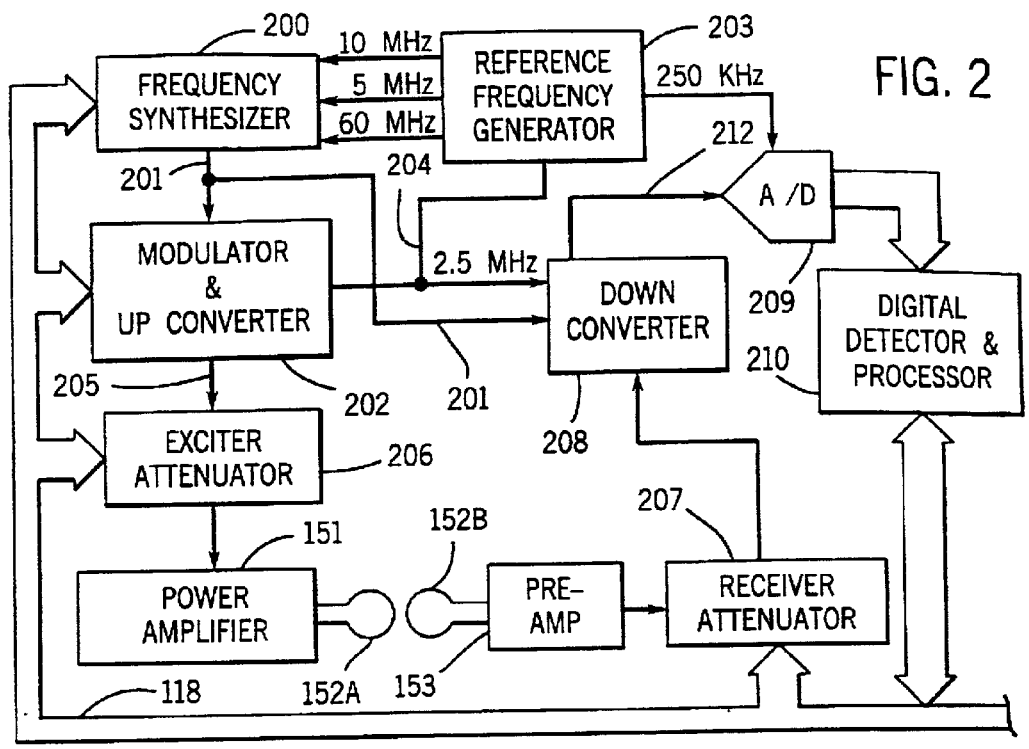
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 205 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

To practice the preferred embodiment of the invention two different pulse sequences are performed by the MRI system of FIG. 1. One of these is a gradient-recalled echo pulse sequence shown in FIG. 3 and the other is a spin echo pulse sequence shown in FIG. 4.

Figure 3:
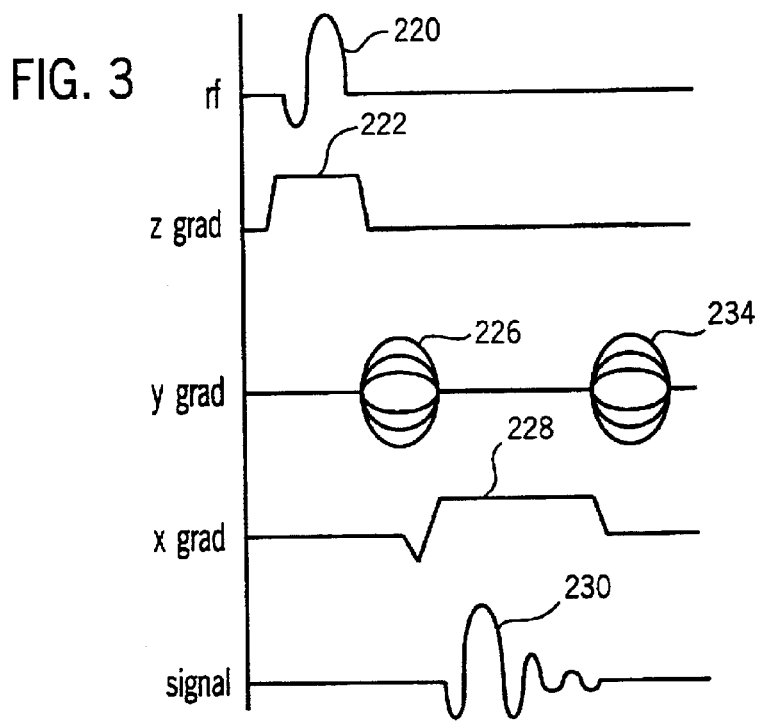
FIG. 3 is a graphic representation of a gradient-recalled echo pulse sequence used in the MRI system of FIG. 1 to practice the preferred embodiment of the invention.

The gradient-recalled pulse sequence in FIG. 3 performs a slice selection by applying a selective RF excitation pulse 220 in the presence of a z-axis slice select gradient waveform 222 to produce transverse magnetization. An NMR echo signal 230 is produced and acquired in the presence of an x-axis readout gradient 228 which encodes for position along a readout axis. This echo signal 230 is referred to as a gradient-recalled NMR echo signal because the transverse magnetization is first dephased by a negative lobe at the beginning of the readout gradient waveform 222 and then refocused by the positive readout gradient lobe. The NMR echo signal 230 is position encoded along a y-axis by a phase encoding gradient pulse 226. The phase of the spin magnetization is subsequently rewound by a corresponding rewinder gradient pulse 234 of the opposite polarity directed along the phase encoding axis. During a scan the pulse sequence is repeated with a different phase encoding which is incremented through 256 discrete values (−128 to +128). The particular scan parameters used will depend on the particular clinical application, but when applied to imaging the prostate an echo time (TE) of as low as 4 ms, a transmit repeat (TR) time ranging from 300 to 400 ms, and a receiver bandwidth of 16 kHz is preferred.

Figure 4:
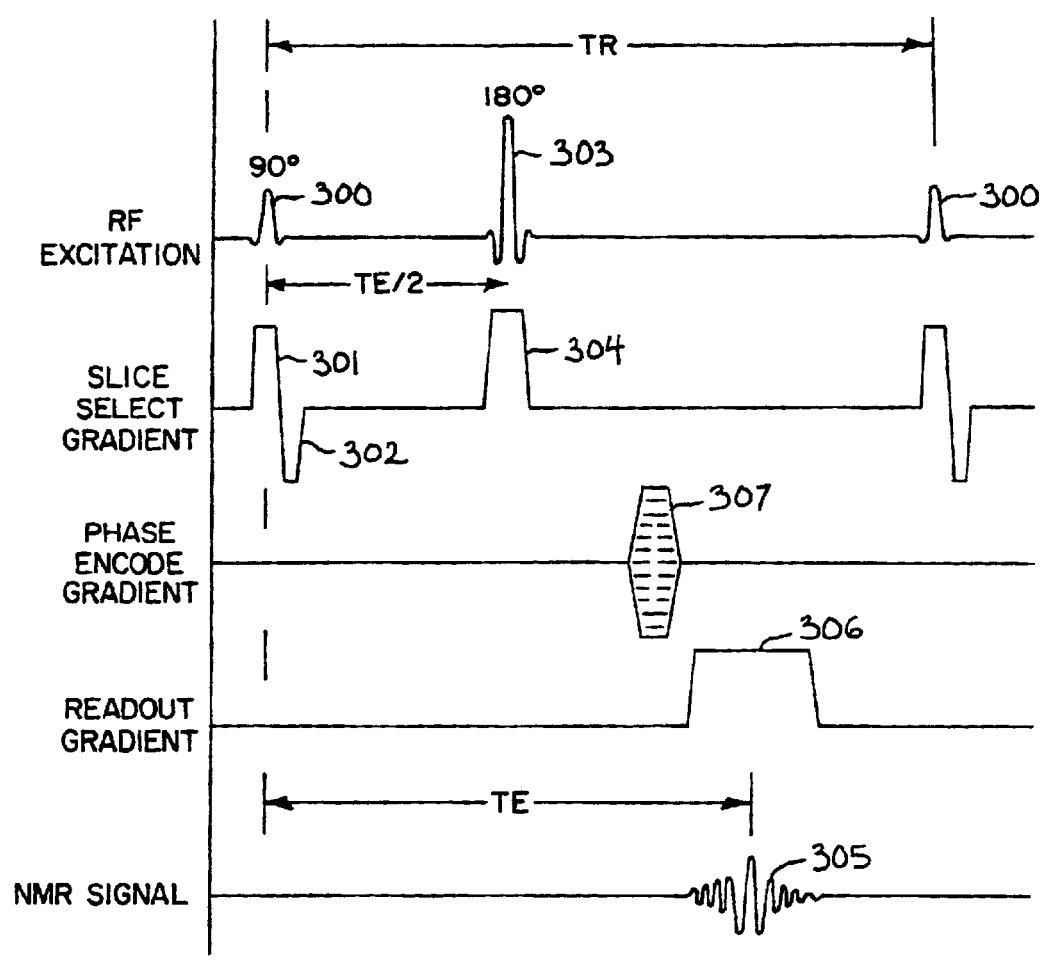
FIG. 4 is a graphic representation of a spin-echo pulse sequence used in the MRI system of FIG. 1 to practice the preferred embodiment of the invention.

The spin-echo pulse sequence of FIG. 4 acquires an image of exactly the same size and location as the gradient-recalled echo pulse sequence of FIG. 3. It performs a slice selection by applying a 90° selective RF excitation pulse 300 in the presence of a z-axis gradient pulse 301 and its associated rephrasing pulse 302. After an interval $TE_1/2$, a 180° selective RF pulse 303 is applied in the presence of another z-axis gradient pulse 304 to refocus the transverse magnetization at the time $TE_1$ and produce an echo NMR echo signal 305. The NMR signal 305 is referred to as a "spin-echo" NMR signal because it is produced by transverse magnetization which is refocused by an RF refocusing pulse 303.

To position encode the spin-echo signal 305, an x-axis read-out gradient pulse 306 is applied during the acquisition of the NMR signal 305. The read-out gradient frequency encodes the NMR signal 305 in the well known manner. In addition, the echo signal 305 is position encoded along the y-axis by a phase encoding gradient pulse 307. The phase encoding gradient pulse 307 has one strength during each pulse sequence, and it is incremented in steps through 256 discrete strengths (−128 to +128) during the scan. As a result, each of the 256 NMR spin-echo signals 305 acquired during the scan is uniquely phase encoded.

As with the gradient-recalled echo pulse sequence, the particular scan parameters for this spin-echo pulse sequence will be determined by the particular clinical application. For prostate imaging a TE of 30 to 150 ms, a TR of 3000 to 4000 ms and a receiver bandwidth of 16 kHz is preferred.

Figure 5:
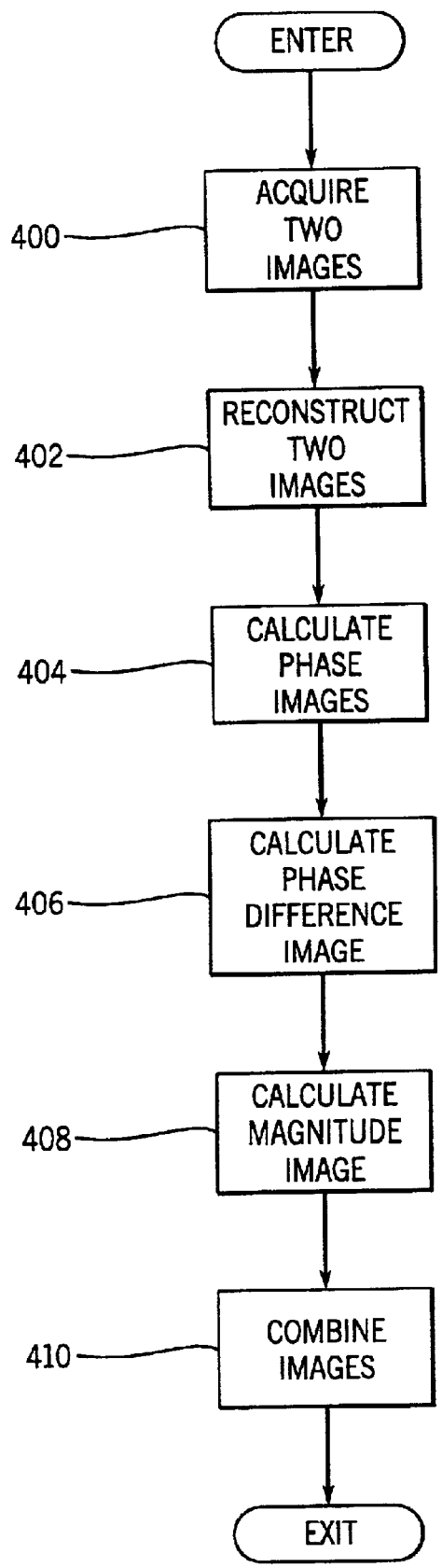
FIGS. 5 and 6 are flow charts of the steps performed by the MRI system of FIG. 1 to practice the preferred embodiment of the invention.
Figure 6:
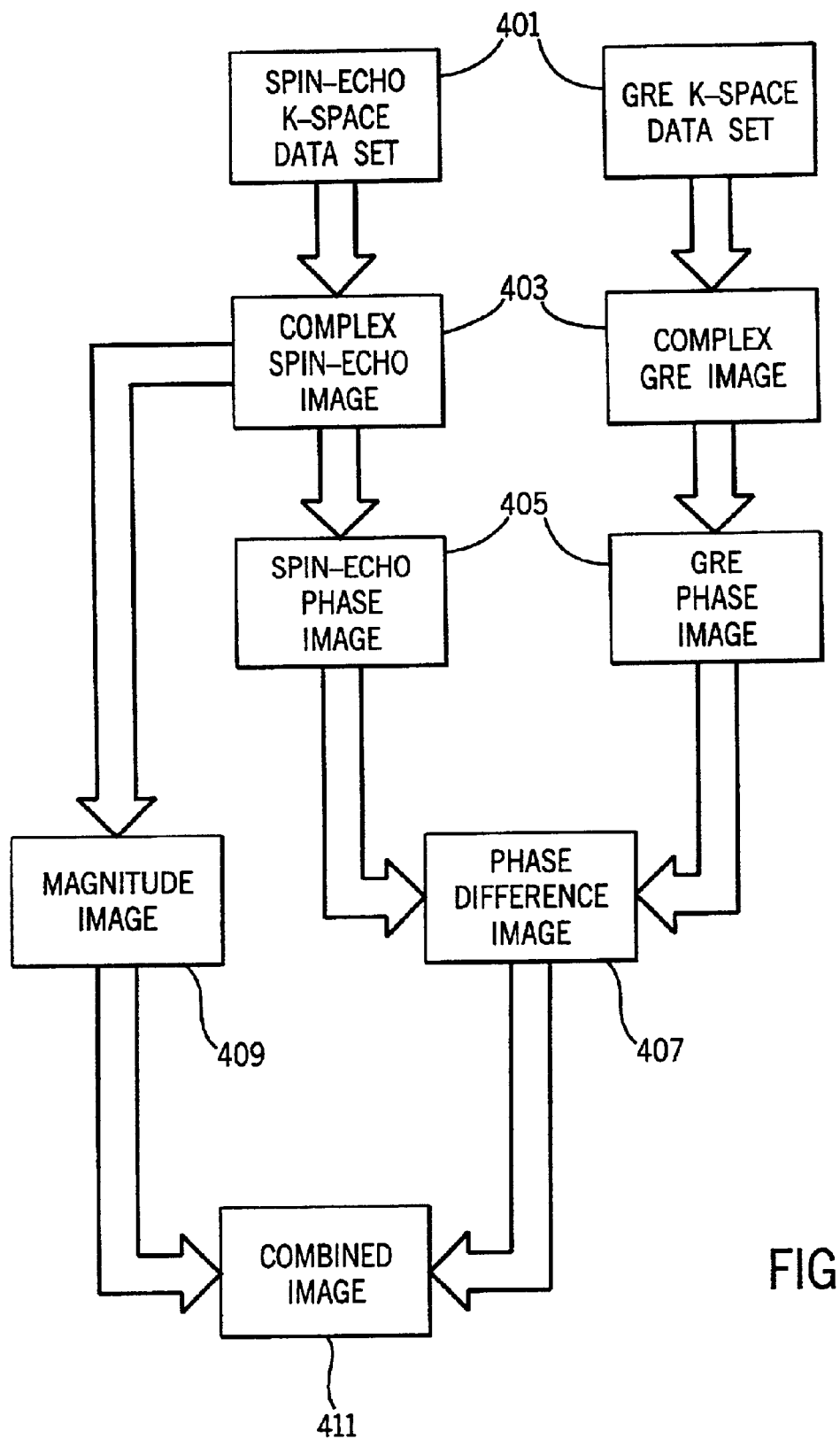

Referring particularly to FIGS. 5 and 6, the first step in the imaging method according to the present invention is to acquire two images as indicated at process block 400. One image is acquired with the GRE pulse sequence of FIG. 3 and the second is acquired with the spin-echo pulse sequence of FIG. 4. Both acquisitions sample the same locations in k-space to produce two 256×256 element k-space data sets 401. The two image acquisitions are done as close in time as possible so that the subject remains in the same position in both acquisitions.

As indicated by process block 402, two separate images 403 are reconstructed from the two acquired k-space data sets 401. This is done by performing a two-dimensional, complex fast Fourier transformation on each k-space data set 401 to produce two, 256×256 pixel complex images 403. Each pixel is a complex number having an I and a Q value. Two corresponding phase images 405 are produced at process block 404 by calculating the phase ($\phi$) at each pixel in the two images 403:

$$\phi = \tan^{-1}(I/Q).$$

The next step is to calculate a phase difference image as indicated at process block 406. The phases at corresponding pixels in each of the two phase images 405 are subtracted to produce a phase difference value $\Delta\phi$ for corresponding pixels in the phase difference image 407:

$$\Delta\phi(x,y) = \Delta\phi_1(x,y) - \Delta\phi_2(x,y).$$

Phase unwrapping may be employed at this point. A number of different methods well known to those skilled in the art may be used to unwrap the phase rolls in the phase image. A simple approach is to take orthogonal profiles through the center of the phase difference image resulting in two one-dimensional phase vectors, $\Delta\phi(x,0)$, and $\Delta\phi(0,y)$ where the coordinate 0,0 represents the center of the image. Phase rolls are then corrected by performing the complex equation:

$$e^{-i(\Delta\phi(x,y) - \Delta\phi(x,0)\Delta\phi(0,y))}.$$

As indicated by process block 408, a conventional magnitude image 409 is also produced from the complex spin-echo image 403. Each pixel magnitude (M) is calculated from the corresponding complex values:

$$M(x, y) = \sqrt{(I(x, y))^2 + (Q(x, y))^2}.$$

A magnitude image can also be calculated from the complex GRE image and the corresponding pixel magnitudes averaged with the spin-echo magnitudes to increase the magnitude image SNR.

The final step as indicated at process block 410 is to determine seed locations from the phase difference image 407 and superimpose their locations on the magnitude image 409. More specifically, the location of each brachytherapy seed is determined by inputting the phase difference image 407 into an automatic seed sorting algorithm such as that described in Brinkmann D H, Kline R W: Automated seed localization from CT datasets of the prostate. Medical Physics 1998; 25(9): 1667–72. The location of each seed is then superimposed on the magnitude image 409 since the phase difference and magnitude images share the same spatial coordinates. Seed locations within the magnitude image can then be described by modifying the magnitude of each pixel so that seed locations are defined by unique gray scale values, or by modifying the color of these pixels. Also, a graphical representation, or icon, with the same dimension as the true seed may be overlaid on the magnitude image at the proper location.

When imaging the prostate with brachytherapy seeds implanted the magnitude image produced as described above differentiates between the various types of soft tissues. The phase difference image on the other hand clearly depicts the seeds as bright objects in a relatively uniform surrounding. The combined images thus produce an image 411 which reveals very clearly the bright seeds surrounded by well differentiated soft tissues.

Many variations are possible from the above-described preferred embodiment. For example, rather than two separate pulse sequences, a single pulse sequence may be used which acquires both a gradient-recalled echo NMR signal and a spin-echo NMR signal. This is particularly useful when patient motion is a problem since corresponding views in both images are acquired at substantially the same tine. Also, while the use of a spin-echo and a gradient-echo pulse sequence is preferred, good results may also be achieved by acquiring two separate GRE images using substantially different scan parameters. For example, a pulse sequence with a TR of 300 to 500 ms that produces two gradient recalled echoes with a TE ranging from 5 to 10 ms for the first echo signal and from 40 to 100 ms for the second echo produces a good phase difference image. Also, the use of a gradient recalled echo signal pulse sequence to acquire two images with vastly different receiver bandwidths (e.g. 8 kHz and 64 kHz) will produce a good phase difference image.

It is also possible to acquire more than one NMR signal with each pulse sequence. For example, multiple spin-echo signals may be acquired with a fast spin-echo (FSE) pulse sequence and multiple gradient-recalled echo signals may be acquired with an echo planar imaging (EPI) pulse sequence. It is also possible to acquire a single complex image using a pulse sequence in which a magnitude image can be reconstructed and a phase image which reveals phase perturbations at each seed location can be reconstructed. With current MRI systems a second phase image is needed as described above to distinguish such perturbations. It is contemplated that this may not be required in the future as MRI system phase errors are reduced.

What is claimed is:

1. A method for producing an image of a subject with a magnetic resonance imaging (MRI) system which enables a previously implanted device to be located, the steps comprising a) acquiring a first k-space data set with the MRI system using a first pulse sequence suitable for imaging stationary spins;

b) acquiring a second k-space data set with the MRI system using a second pulse sequence suitable for imaging stationary spins which is different from the first pulse sequence;

c) reconstructing first and second complex MR images of the subject from the respective first and second k-space data sets;

d) calculating a magnitude MR image from either one of said first or second complex MR images reconstructed in step c); and e) calculating a phase difference MR image between the first and second complex MR images of step c);

f) employing the phase difference MR image of step e) to locate the implant in the subject; and g) displaying the location of the implant from step f) in the magnitude MR image from step d).

2. The method as recited in claim 1 in which said first pulse sequence is a spin-echo pulse sequence in which an NMR echo signal is produced after an RF refocusing pulse is produced, and the second pulse sequence is a gradient-recalled echo pulse sequence in which an NMR echo signal is produced after an RF excitation pulse is produced.

3. The method as recited in claim 1 in which step c) is performed by performing a complex Fourier transformation of each of the first and second k-space data sets.

4. The method as recited in claim 1 in which step e) is performed by:
i) calculating a first phase image from the first complex image;
ii) calculating a second phase image from the second complex image;
iii) calculating the phase difference image by computing the phase difference between corresponding pixels in the first and second phase images.

5. The method as recited in claim 1 in which the subject is tissues containing an implant.

6. The method as recited in claim 5 in which the tissues include a human prostate and the implant is a brachytherapy seed.

7. A method for producing an image of a subject with a magnetic resonance imaging (MRI) system which differentiates between soft tissues and which differentiates between tissues and a device, the steps comprising
a) acquiring a first k-space data set with the MRI system using a spin-echo pulse sequence;
b) acquiring a second k-space data set with the MR images of the subject from gradient-recalled echo pulse sequence;
c) reconstructing first and second complex MR images of the subject from the respective first and second k-space data sets;
d) calculating a phase difference MR image between the first and second complex images which differentiates between tissues and the device;

e) calculating a magnitude MR image from either one of said first or second complex MR images which differentiates between tissues; and f) combining the phase difference MR image of step d) with the magnitude MR image of step e) to form the image of the subject.

8. A method for producing an image of tissues containing an implant with a magnetic resonance imaging (MRI) system, the steps comprising:
a) acquiring first and second k-space data sets with the MRI system by performing a series of pulse sequences which acquire a set of NMR spin-echo signals for the first k-space data set and a set of NMR gradient-recalled echo signals for the second k-space data set;
b) reconstructing first and second complex MR images of the tissues containing the implant from the respective first and second k-space data sets;
c) calculating a phase difference MR image between the first and second complex MR images;
d) calculating a magnitude MR Image using data from either said first or second complex MR images; and
e) employing the phase difference MR image of step c) to display the location of the implant in the magnitude MR image of step d) and form the image.

9. The method as recited in claim 8 in which step b) is performed by performing a complex Fourier transformation of each of the first and second k-space data sets.

10. The method as recited in claim 8 in which step a) is performed by:
i) performing a first pulse sequence to acquire the NMR spin-echo signals; and
ii) performing a different pulse sequence to acquire the NMR gradient-recalled signals.

11. The method as recited in claim 10 in which one NMR signal is acquired with each pulse sequence.

12. The method as recited in claim 8 in which step c) is performed by:
i) calculating a first phase image from the first complex image;
ii) calculating a second phase image from the second complex image;
iii) calculating the phase difference image by computing the phase difference between corresponding pixels in the first and second phase images.

13. The method as recited in claim 8 in which the tissues include a human prostate and the implant is a brachytherapy seed.

14. The method as recited in claim 8 in which the implant is formed of titanium.

15. The method as recited in claim 8 in which step e) is performed by overlaying a graphical representation of the implant at the implant location.

16. The method as recited in claim 8 in which step e is performed by modifying pixels in the magnitude image at the implant location.

* * * * *